United States Patent [19]

Mattern

[11] 3,745,559

[45] July 10, 1973

[54] ANALOG TO DIGITAL CONVERTER

[75] Inventor: John Mattern, Baltimore, Md.

[73] Assignee: Westinghouse Electric Corporation, Pittsburgh, Pa.

[22] Filed: June 1, 1972

[21] Appl. No.: 258,600

[52] U.S. Cl. .......................... 340/347 AD, 324/83 D

[51] Int. Cl. .......................................... H03k 13/02

[58] Field of Search .............. 340/347 AD, 347 SY, 340/347 DD, 171 R; 324/83 D

[56] References Cited

UNITED STATES PATENTS

| | | | |
|---|---|---|---|
| 3,068,456 | 12/1962 | Nevius | 340/347 AD |
| 3,343,157 | 9/1967 | Carre et al. | 340/347 SY |
| 3,521,170 | 7/1970 | Leuthold et al. | 340/347 AD |
| 3,533,101 | 10/1970 | Lauchner et al. | 340/347 AD |
| 3,624,641 | 11/1971 | Brennan | 340/347 AD |

*Primary Examiner*—Thomas A. Robinson
*Attorney*—F. H. Henson et al.

[57] ABSTRACT

Apparatus for directly generating a cyclical multi-bit Gray code digital output by means of a plurality of identical cascaded frequency multiplier stages, each of which includes a frequency doubler, a mixer, a phase detector and a squaring amplifier, wherein the output of each frequency doubler is translated to its input frequency and phase detected against a reference carrier signal. The output of each stage when limited, provides a digitized output bit in a Gray code format.

10 Claims, 2 Drawing Figures

ANALOG TO DIGITAL CONVERTER

BACKGROUND OF THE INVENTION

1. Field of the Invention

This invention relates to analog to digital converters in general and particularly to a Gray code converter which is capable of providing operation at word rates exceeding 10MHz.

Description of the Prior Art

The present analog to digital converters have one of two disadvantages which limit their usefulness at microwave operating frequencies. In parallel conversion devices, $2^n-1$ comparators are required. This can place a severe burden on the equipment when the number (N) of bits exceeds four or more. When counting devices are utilized to configure analog to digital converters, the accumulation of propagation and rise times required to implement a decision and a subtraction places a limitation on speed of operation. Also, the probability of unwanted transient signals being introduced into the system in a straight binary operation is greater than when a Gray code system is used. In the Gray code system, during a counting operation only one digit position is changed in any given time.

One type of high speed converter having a Gray code output is disclosed in U.S. Pat. No. 3,533,101 issued to J. K. Lauchner, et al. This patent, however, discloses a frequency to digital conversion wherein a plurality of wide band FM line discriminators receive a frequency varying signal. Each discriminator supplies an output signal that varies in amplitude according to variations in the input frequency with the output signal reversing polarity once every given increment in frequency determined by electrical length of the lines in the discriminators. The electrical lengths in the various discriminators are related to each other by the powers of 2 and arranged to supply a binary Gray coded digital output signal indicative of frequency changes.

An analog to digital conversion which converts a varying analog signal to the nearest available digital value by the successive approximation technique is disclosed in U.S. Pat. No. 3,577,194 issued to Donald L. Beall. The circuit disclosed therein includes a summing mode for the analog and various digital voltages followed by a chopper switch, AC amplifier, sample and hold circuit, voltage comparator and digital approximation control circuits.

SUMMARY

The present invention avoids the inherent difficulties present in prior art apparatus by means of a direct conversion which combines the simplicity of successive approximation with the speed of open loop operation as in the parallel converter.

Briefly, the subject invention includes means whereby a sampled analog signal is used to phase modulate a sinusoidal reference carrier signal $\sin\omega t$ by an angle $\theta$ wherein $\theta$, which may have a range of $\pm 90°$, is the function of the analog input. The modulated output $\sin(\omega t+\theta)$ is applied to a phase detector along with a second reference carrier signal $\cos\omega t$ which extracts a signal corresponding to the sine of the phase angle $\theta$, i.e., $\sin\theta$. The signal corresponding to the $\sin\theta$ is applied to a non-inverting squaring amplifier whereupon the output becomes the sign bit of a multi-bit Gray code output. Following this, $N$ identical conversion stages are cascaded in the following manner. In the first stage, the phase modulated reference signal $\sin(\omega t+\theta)$ is applied to a frequency ($x2$) multiplier which increases the phase modulation by a factor of 2 to $2\theta$. The output of the frequency doubler is translated to the original carrier frequency by means of a mixer which receives another input of the signal $\cos\omega t$. The mixer output signal $\sin(\omega t + 2\theta)$ is phase detected against the reference signal $\sin\omega t$ in a phase detector. The output of the phase detector is fed to a limiter and is seen to behave as the $2^{nth}$ bit in a Gray code format. The mixer output signal $\sin(\omega t + 2\theta)$ is also fed to the frequency multiplier of the succeeding stage and the same process repeats itself for the following stages.

This mode of operation makes use of the ambiguities in the frequency multiplier to generate the required cyclic output. The remaining $N$ stages are identical and produce the corresponding variations with the input phase in the Gray code format.

DESCRIPTION OF THE PREFERRED EMBODIMENT

Figure 1:
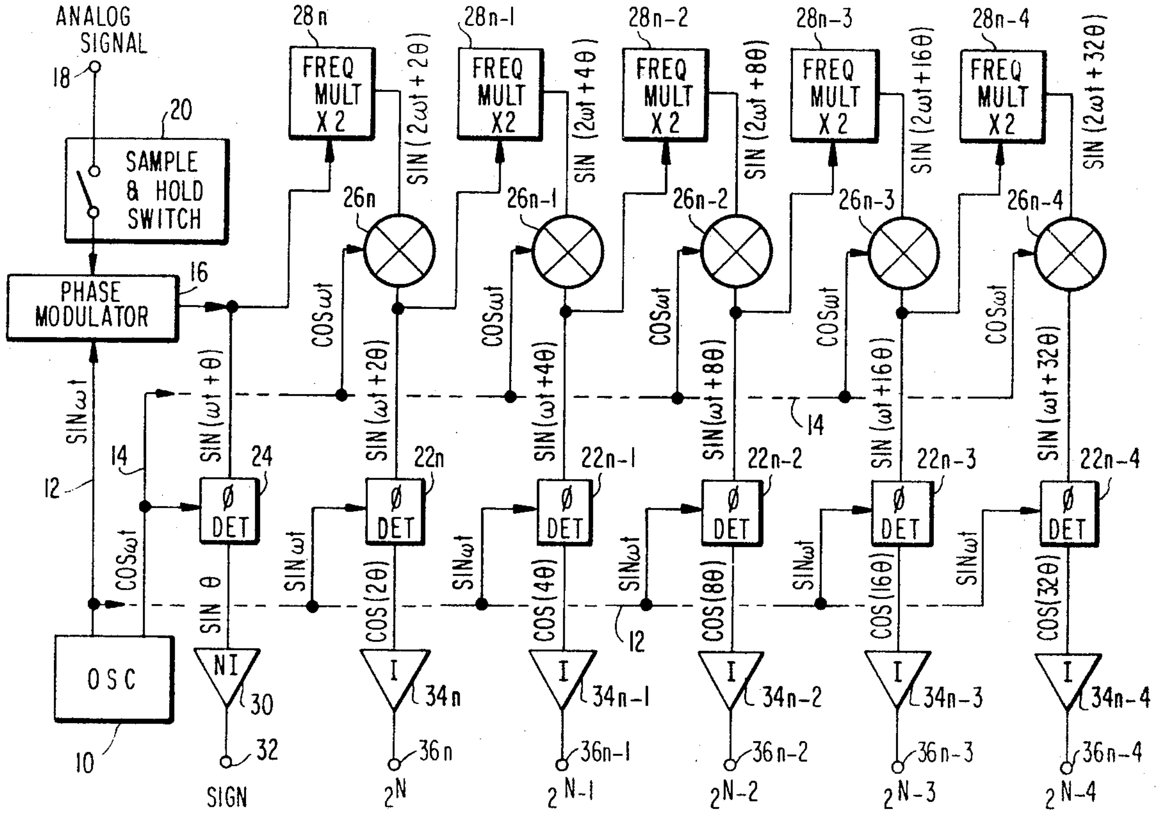
FIG. 1 is a block diagram illustrative of the preferred embodiment of the subject invention.

Referring now to FIG. 1, reference numeral 10 denotes a carrier frequency oscillator of a fixed frequency operable preferably but not limited to the range of 100–200MHz. The oscillator 10 provides a sine and cosine output which comprises a first and second reference carrier signal. These signals respectively appear on circuit lines 12 and 14. The sinusoidal reference signal $\sin\omega t$ is applied to a phase modulator circuit 16 where it is shifted in phase by an angle $\theta$ between the limits of + and −90° in accordance with the amplitude of the sampled analog input signal applied to terminal 18 and fed to the phase modulator 16 through a sample and hold switch 20.

The sinusoidal reference signal $\sin\omega t$ is also simultaneously applied to one input of the phase detectors $\mathbf{22}_n$, $\mathbf{22}_{n-1}$, $\mathbf{22}_{n-2}$, $\mathbf{22}_{n-3}$ and $\mathbf{22}_{n-4}$, respectively, included in $N = 5$ identical conversion stages for a 5 bit converter. The cosinusoidal reference signal $\cos\omega t$ output from the oscillator 10 is commonly fed to a phase detector 24 which is utilized to derive the sign bit and to frequency mixers $\mathbf{26}_n$, $\mathbf{26}_{n-1}$, $\mathbf{26}_{n-2}$, $\mathbf{26}_{n-3}$ and $\mathbf{26}_{n-4}$ of the $N = 5$ stages. Each of the $N$ stages are identical in that they additionally include a respective frequency ($x2$) multiplier $\mathbf{28}_n$, $\mathbf{28}_{n-1}$, . . . $\mathbf{28}_{n-4}$. The frequency multipliers $\mathbf{28}_n$. . . $\mathbf{28}_{n-4}$ have their outputs fed to the respective mixers $\mathbf{26}_n$ . . . $\mathbf{26}_{n-4}$. The input to the first frequency multiplier $\mathbf{28}_n$ comprises the output $\sin(\omega t+\theta)$ of the phase modulator 16 which signal is also coupled to the input of the sign bit phase detector 24. Thereafter, the input signal to the remaining frequency multipliers $\mathbf{28}_{n-1}$ . . . $\mathbf{28}_{n-4}$ respectively comprises the output of the immediately preceding stage mixer $\mathbf{26}_n$ . . . $\mathbf{26}_{n-3}$. The respective outputs of the mixers $\mathbf{26}_n$ . . . $\mathbf{26}_{n-4}$ are additionally coupled to the respective phase detectors $\mathbf{22}_n$ . . . $\mathbf{22}_{n-4}$.

The output of the sign bit phase detector 24 is fed to a non-inverting squaring amplifier 30 whose output appears at terminal 32 while the $N = 5$ identical converter stages have their respective phase detectors $\mathbf{22}_n$ . . .

$22_{n-4}$ coupled to inverting squaring amplifiers $34_n$, $34_{n-1}$, $34_{n-2}$, $34_{n-3}$ and $34_{n-4}$. The respective outputs of the inverting squaring amplifiers $34_n \ldots 34_{n-4}$ comprise digital output bits which appear at output terminals $36_n \ldots 36_{n-4}$.

In operation, the sampled analog signal present in the sample and hold switch 20 is used to phase modulate the sinusoidal reference signal $\sin\omega t$ appearing on line 12. Depending upon the amplitude of the analog input, the phase modulator 16 shifts sinusoidal reference to provide an output signal of $\sin(\omega t+\theta)$ which is then applied to the phase detector 24 and the frequency multiplier $28_n$. The other reference signal output from the oscillator 10 constituting the signal $\cos\omega t$ is applied to the phase detector 24 and results in an output therefrom of a signal corresponding to $\sin\theta$. This signal is applied to the noninverting squaring amplifier 30 which provides a digital output signal which becomes the sign bit of a Gray code output.

The output of the phase modulator 16 which comprises the signal $\sin(\omega t+\theta)$ is also applied to the frequency multiplier $28_n$ which multiplies the frequency by a factor of 2 to provide an output signal of $\sin(2\omega t+2\theta)$. This signal is applied to mixer $26_n$ which has as its other input the second reference signal $\cos\omega t$ of the oscillator 10. Although a mixer is adapted to provide sum and difference frequencies, the mixer $26_n$ is fabricated such that a difference output corresponding to $\sin(2\omega t+2\theta) - \cos 107t = \sin(\omega t+2\theta)$ is provided. While the frequency multiplier $28_n$ increases the phase modulation by a factor of 2, i.e., $2\theta$, the mixer $28_n$ translates the multiplier output to the original carrier frequency further shifted in phase by an amount of $2\theta$. The phase detector $22_n$ inputs which comprises the refernence signal $\sin\omega t$ and the mixer output $\sin(\omega t+2\theta)$ provides an output corresponding to the signal of $\cos(2\theta)$. The waveform 40 is utilized to generate the $2^n$ bit in a Gray code format. The remainder of the stages are cascaded such that the output of the preceding mixer is fed to the frequency multiplier of the instant stage where the phase shift is continually advanced by a factor of 2, whereupon the phase detectors $22_{n-1}$, $22_{n-2}$, $22_{n-3}$ and $22_{n-4}$ provide respective outputs corresponding to $\cos(4\theta)$, $\cos(8\theta)$, $\cos(16\theta)$ and $\cos(32\theta)$. By squaring and inverting the signals in the respective amplifiers $34_{n-1} \ldots 34_{n-4}$ output waveforms appear as the Gray code digital outputs for the $2^{N-1}$ through $2^{N-4}$ bits.

Figure 2:
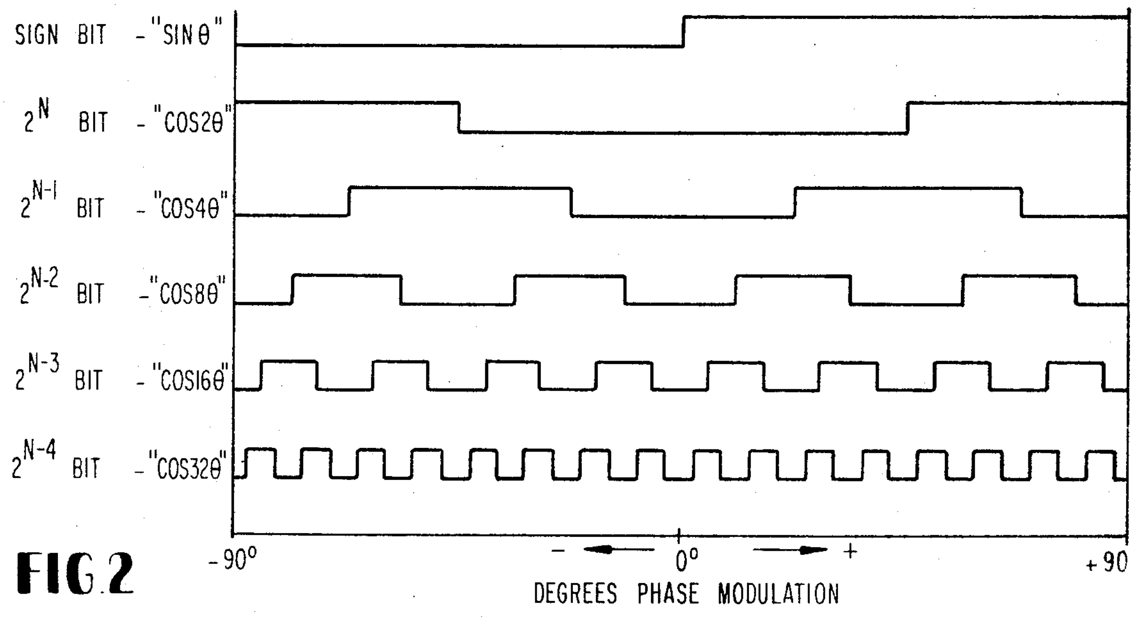
FIG. 2 is a diagram of the phase shift variation of the respective digital outputs as a function of the analog input.

The diagram of FIG. 2 is not meant to be interpreted as a group of time related digital output waveforms but is analogous to a truth table in that it is illustrative of the phase shift variation in each of values $\sin\theta$, $\cos 2\theta$, $\ldots \cos 32\theta$ as a function of the sampled analog input. It is immediately seen that the overall variation conforms to the Gray code format.

The phase modulator 16 and the cascading of the $N$ stages makes use of the ambiguities in the frequency multipliers themselves to generate the required cyclic output. It is also to be noted that the $2^{N-4}$ bit output is not affected by any previous result. Thus the delays in the multiplier chain can be compensated by delay of the digital outputs. Also, the propagation times in the phase detectors and in the squaring amplifiers do not limit the word rate. In an analog to digital converter as shown in FIG. 1, the word rate is limited primarily by the carrier frequency of the oscillator 10 while the number of cascaded stages will depend primarily on the phase accuracy of the stage. For example, a carrier frequency of 200MHz will provide an operation at a word rate of 20MHz. Phase accuracy of 1° will allow approximately 7 bit resolution.

Several advantages are obtained by means of the subject invention, the first of which is that the first approximation propagation in setting times do not limit the speed of operation. Secondly, the converter is primarily comprised of $N$ identical circuit stages. Thirdly, the word rate can be increased roughly in proportion to the carrier frequency until limited by the frequency limit of the active devices. Fourthly, the first approximation amplitude changes do not affect accuracy as accuracy is primarily dependent upon phase characteristics. Finally, the Gray code format further eliminates switching ambiguities.

Having described what is at present considered to be the preferred embodiment of the subject invention,

I claim:

1. Analog to digital conversion apparatus comprising, in combination:

means for providing a first and second refernece signal of the same carrier frequency;

input means for receiving an analog input signal;

a phase modulator coupled to said analog input signal and said first reference signal whereby said modulator shifts the phase of said first reference signal as a function of the analog input signal and provides an output signal in accordance therewith;

a plurality of $N$ identical cascaded conversion stages providing $N$ digital output bits respectively in a Gray code format, each stage including, a frequency multiplier, a dual input frequency mixer having one input coupled to the output of said frequency multiplier circuit, a dual input phase detector having one input coupled to the output of said mixer, and a squaring amplifier coupled to the output of the phase detector for providing a digital output bit;

circuit means coupling the output of said phase modulator to the input of the frequency multiplier of the first stage;

circuit means coupling the output of all the mixers respectively to the input of the succeeding frequency multiplier;

circuit means coupling said second reference signal to the other input of all said mixers; and circuit means coupling said first reference signal to the other input of all said phase detectors.

2. The apparatus as defined by claim 1 wherein said frequency multiplier circuits of all said $N$ conversion stages multiply the frequency of the respective input signal by a factor of 2.

3. The apparatus as defined by claim 2 and additionally including a sign bit conversion stage comprising another dual input phase detector circuit having one input coupled to the output signal of said phase modulator and the other input to said second reference signal, and a squaring amplifier coupled to the output of said phase detector for providing a digital signal output.

4. The apparatus as defined by claim 3 wherein said means for providing a first and second reference signal comprises a sine wave oscillator.

5. The apparatus as defined by claim 4 wherein said oscillator comprises a microwave signal generator.

6. The apparatus as defined by claim 1 wherein said input means comprises a sample and hold circuit.

7. The apparatus as defined by claim 3 wherein said squaring amplifiers of said *N* identical conversion stages include signal inversion means and wherein said squaring amplifier in said sign bit conversion stage comprises non-inverting signal means.

8. The apparatus as defined by claim 1 wherein said phase modulator is adapted to phase modulate said first reference signal between the limits of +90° and −90° in accordance with the magnitude of said analog input signal.

9. The apparatus as defined by claim 1 wherein said first and second reference signals comprise the signals $\sin\omega t$ and $\cos\omega t$, respectively.

10. The apparatus as defined by claim 9 wherein $\omega = 2\pi f$ and wherein $f$ is a carrier frequency in the microwave range.

* * * * *